(12) United States Patent
Chen

(10) Patent No.: US 7,605,431 B2
(45) Date of Patent: Oct. 20, 2009

(54) ELECTROSTATIC DISCHARGE PROTECTION APPARATUS FOR SEMICONDUCTOR DEVICES

(75) Inventor: Tung-Yang Chen, Tainan (TW)

(73) Assignee: Himax Technologies Limited (TW)

( * ) Notice: Subject to any disclaimer, the term of this patent is extended or adjusted under 35 U.S.C. 154(b) by 497 days.

(21) Appl. No.: 11/533,569

(22) Filed: Sep. 20, 2006

(65) Prior Publication Data

US 2008/0067601 A1  Mar. 20, 2008

(51) Int. Cl.
  *H01L 23/60*  (2006.01)
(52) U.S. Cl. ......................... 257/370; 361/56
(58) Field of Classification Search ................. 257/355, 257/362, 370, 378; 316/56
See application file for complete search history.

(56) References Cited

U.S. PATENT DOCUMENTS 6,297,536 B2  10/2001  Yu
6,492,208 B1 *  12/2002  Cheng et al. ................. 438/133
6,492,859 B2  12/2002  Vashchenko et al.
7,042,028 B1 *  5/2006  Huang et al. ................. 257/173
2002/0017654 A1 *  2/2002  Lee et al. ..................... 257/173

\* cited by examiner

*Primary Examiner*—Thomas L Dickey
(74) *Attorney, Agent, or Firm*—Baker & McKenzie LLP

(57) ABSTRACT

The present invention provides several embodiments with layout patterns for ESD protection. An apparatus with a layout pattern may be configured to protect I/O pads or the power rail. The layout pattern may designed to increase the current paths for ESD stress currents. For example, more rings may be applied. The present invention also provides circuit embodiments for ESD protection. According to one embodiment, an ESD protection circuit comprising four parasitic BJTs may be configured to protect the I/O pads or the power rail. More BJTs or resistors may be used to increase the current paths for ESD stress currents. Several variations and modifications may be made by changing the doping profiles of the doped regions.

13 Claims, 13 Drawing Sheets

US 7,605,431 B2

ELECTROSTATIC DISCHARGE PROTECTION APPARATUS FOR SEMICONDUCTOR DEVICES

FIELD OF THE INVENTION

The present invention relates to ESD (Electro Static Discharge) protection apparatuses, and more particularly, it relates to an ESD circuit and layout for the protection of other circuit components manufactured by a high voltage semiconductor process.

BACKGROUND OF THE INVENTION

ESD protection circuit is a component commonly found in almost every semiconductor chip. The ESD protection circuit protects a semiconductor chip from damages caused by transient voltages or currents. Transient voltages or currents brought by accumulated charges of certain materials can easily release charges due to friction. Therefore, ESD protection circuits are invented and positioned closely to pads in the chips. When excessive transient voltages or currents occur, ESD protection circuits can respond in time and direct the excessive transient voltages or currents into the power rails to avoid those voltages or currents from flowing to the core circuits.

There are three main categories of ESD modes which are MM (Machine Mode), HBM (Human Body Mode) and CDM (Charge Device Mode) depending on where the accumulated charges come from. The MM mode is used to simulate the manufacturing environment and there are several specifications designated for the MM mode. The HBM mode is used to simulate the static charges caused by human bodies when people touch the pins of semiconductor chips with their hands. Those charges will flow through the pins and cause damages to the semiconductor chips. The CDM mode is the most undesirable mode for chips with large chip areas. The static charges of the CDM mode are charges accumulated inside the body of a chip during the manufacturing processes and will discharge to the outside environment regardless of whether the environment has static charges or not. Thus, since static charges may exist anywhere an effective ESD protection becomes ever more important.

The simplest ESD protection circuit comprises of two reverse biased diodes, one formed between the power source and an input pad, and the other between the ground and the input pad. Both reverse biased diodes are turned off when the chip is operating under normal conditions. A normal power supplier often provides voltages that does not exceed fifty volts. The reverse biased diode turns into break down mode when the voltage on the input pad exceeds the break down voltage of the reverse biased diode. A diode under break down mode can bypass and shunt the current quickly. A diode also sustains more ESD stress than other circuit components, e.g., MOS (Metal Oxidation Semiconductor) devices or BJT (Bipolar Junction Transistor) devices.

U.S. Pat. No. 6,297,536 to Yu, entitled "Diode structure compatible with silicide processes for ESD protection," discloses a diode structure having a diffusion region where the whole edge is encompassed by N-well to increase the ballistic resistance of the diode under high current stressing conditions. The disclosure of this patent is hereby incorporated by reference. The diode structure also has a silicide layer covering the diffusion region such that a discharge current can flow through the silicide layer and the diffusion region uniformly because the silicide layer provides better conductive property. An ESD protection circuit utilizing a diode structure as a discharging tool has the advantages of simplicity and small area, but it can not respond to large transient voltages or currents in a short time. It can delay the response time for large transient voltages or currents which require a large junction area to pass through because larger area creates larger parasitic capacitance. If the parasitic capacitor is too large, the protection mechanism of the ESD diode may not be able to react with those discharging events. Therefore, several ESD protection circuits may employ active circuit components, e.g., parasitic bipolar junction transistors, to actively and effectively discharge transient voltages or currents.

U.S. Pat. No. 6,492,859 to Vashchenko et al., entitled "Adjustable electrostatic discharge protection clamp," discloses an ESD protection circuit for an analog bipolar circuit. The disclosure of this patent is hereby incorporated by reference. The ESD protection circuit in the prior art uses a reverse-coupled NPN BJT acting as an avalanche diode which has a breakdown voltage adjustable by a resistor between the base and collector of the BJT. The reverse-coupled NPN BJT forces another PNP BJT into conduction such that the base current of the PNP BJT is multiplied by the reverse-coupled NPN BJT. The resistor is connected to the reverse-coupled transistor to adjust the breakdown voltage of the reverse-coupled transistor. Effectively, the resistor is used to reduce the breakdown voltage of the reverse-coupled transistor. Although an adjustable resistor is used in this disclosure, the invention does not show any compact layout pattern associated with the disclosed circuit.

In FIG. 1, it shows layout patterns of an ESD protection circuit for high voltage application according to a conventional design. A layout pattern 11 of the ESD protection circuit on a P type substrate has an N type heavily doped region 2, an N type lightly doped region 3, a P type heavily doped region 6 and a P type lightly doped region 5. The N type lightly doped region 3 forms a PN junction diode with the P type substrate that couples with a P type heavily doped region 4. The P type lightly doped region 5 also forms a PN junction diode with an additional N type WELL region 1 encompassing an N type heavily doped region 8, the P type heavily doped region 6 and the P type lightly doped region 5. The N type WELL region 1 is an N type doped region functioned as a substrate of P type semiconductor devices. The ESD protection circuit generally has two PN junction diodes wherein the diodes are formed by two parasitic bipolar junction transistors with appropriate electrical connections. Generally, a simple electrical configuration can be a metal wire connected to an I/O pad to the N type heavily doped region 2 and the P type heavily doped region 6 with the P type heavily doped region 4 connected to the ground and the N type heavily doped region 8 connected to the power.

The layout pattern of the ESD protection circuit in FIG. 1 forms the conventional ESD protection circuit comprising two reverse biased diodes, one formed between the power source and an input, and the other between the ground and the input pad.

SUMMARY OF THE INVENTION

One aspect of the present invention discloses a layout pattern of an ESD protection circuit to protect semiconductor chips from the electro-static discharge, especially ones manufactured by high voltage processes. In one embodiment, an apparatus with a layout pattern for an ESD protection circuit comprises a first N type doped region; a first P type doped region coupled with the first N type doped region; a second N type doped region encompassed by a first N type WELL region; and the N type WELL region encompasses the first P type doped region. There may be a plurality of N type doped regions encompassed by the first P type doped region. The first N type doped region may be lightly doped. An N type heavily doped region may be positioned in the first N type doped region to improve electrical contact characteristics with electrodes.

According to the invention, an apparatus with a layout pattern of an ESD circuit for protecting I/O pads may further comprises a second P type doped region; a third N type doped region coupled with the second P type doped region; a third P type doped region encompassing the third N type doped region; a second N type WELL region encompassing the third N type doped region; and the second P type doped region electrically couples with the first N type doped region. There may be a plurality of P type doped regions encompassed by the third N type doped region. The second P type doped region may be lightly doped. A P type heavily doped region may be positioned in the second P type doped region to improve electrical contact characteristics.

According to the invention, an apparatus with a layout pattern of an ESD circuit for protecting I/O pads may further comprises a fourth P type doped region encompassing the first N type WELL region; a fourth N type doped region encompassed by a third N type WELL region; and the fourth N type doped region encompasses the third P type doped region.

According to the invention, an apparatus with a layout pattern may be configured to clamp the ESD stress transient on a power pad. Similar to the apparatus of an ESD circuit for protecting I/O pads, the first N type doped region electrically couples with the third N type doped region. The second P type doped region electrically couples with the third P type doped region instead of with the first N type doped region as in the ESD circuit for protecting I/O pads.

According to the invention, an apparatus with a layout pattern may be configured to clamp the ESD stress transient on a ground pad. Similar to the apparatus of an ESD circuit for protecting I/O pads, the first N type doped region electrically couples with the second N type doped region. The second P type doped region electrically couples with the first P type doped region, instead of with the first N type doped region as in the ESD circuit for protecting I/O pads.

Another aspect of the present invention discloses an ESD protection circuit comprising a first BJT, the base and emitter thereof connected to a power rail; a second BJT, the base thereof connected to the collector of the first BJT, the collector thereof connected to the power rail; a third BJT, the base and emitter thereof connected to the power rail; a fourth BJT, the base thereof connected to the collector of the third BJT, the collector thereof connected to the power rail; a first resistor electrically connected to the collector and the emitter of the first BJT; a second resistor electrically connected to the collector and the emitter of the third BJT; and an electrical means coupling the collector of the second BJT with the collector of the fourth BJT. The ESD protection circuit may further comprise more parasitic BJTs to provide more current paths for ESD stress currents.

Another aspect of the present invention discloses an ESD protection circuit comprising a first BJT, the collector thereof connected to a first pad, the emitter thereof connected to a second pad; a second BJT, the collector thereof connected to the second pad, the emitter thereof connected to the first pad; a first electrical means coupling the base of the first BJT with the collector thereof; and a second electrical means coupling the base of the second BJT with the collector thereof. The electrical means may comprise a conductive wire, e.g., a metal wire or a poly wire. Alternatively, the electrical means may comprise a BJT forming a feedback loop.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

Figure 2:
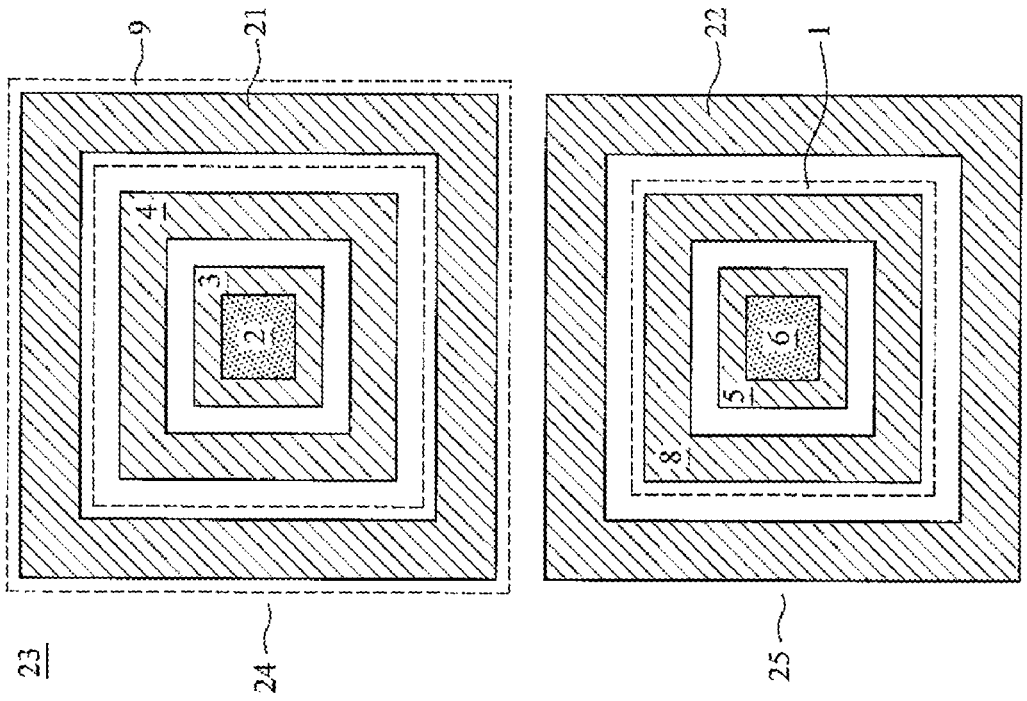
FIG. 2 shows layout patterns of an ESD protection circuit for high voltage application according to one embodiment of the present invention.
Figure 1:
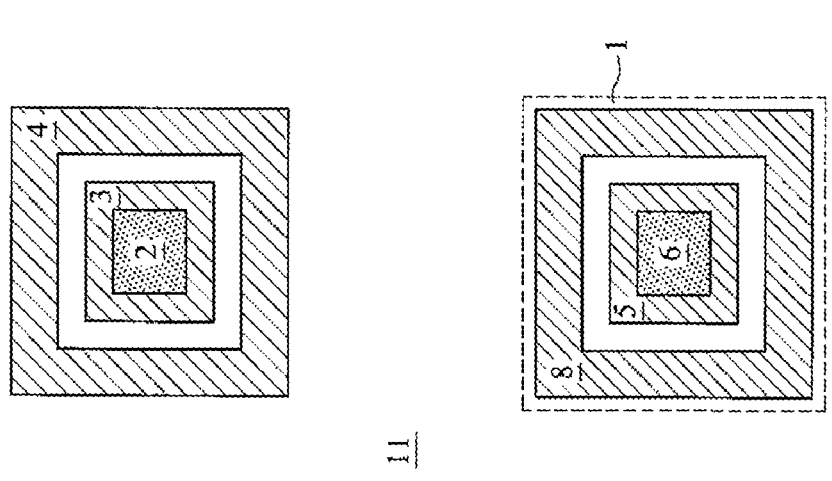
FIG. 1 shows layout patterns of an ESD protection circuit for high voltage application in the prior art.

FIG. 2 shows layout patterns 23 of an ESD protection circuit on a substrate for high voltage applications. According to one embodiment of the present invention, a layout pattern 24 comprises an N type lightly doped region 3, a P type heavily doped region 4, and an N type WELL region 9 encompassing an N type heavily doped region 21. In one embodiment, the N type lightly doped region 3 is surrounded by two rings including the P type heavily doped region 4 and the N type heavily doped region 21. The N type lightly doped region 3 may encompass an N type heavily doped region 2 for connection to an electrode with better electrical properties.

The P type heavily doped region 4 may be entirely or partially replaced by a lightly doped region. The P type heavily doped region 4 connects to the substrate where the circuit components or the layout patterns are developed on. In this embodiment, the substrate may be a P type substrate. Similarly, the N type heavily doped region 21 may be entirely or partially replaced by a lightly doped region. The N type heavily doped region 21 connects to the N type WELL region 9. It is well known to those skilled in the art that the heavily doped region performs better joint properties to electrodes than the lightly doped region, so that several variations may be made by those skilled in the art to change the properties of the heavily doped regions including the layout patterns or the doped concentration. The layout pattern 24 forms an ESD protection circuit comprising two transistors which will be described later in FIG. 6.

According to another embodiment of the present invention, a layout pattern 25 of an ESD protection circuit for high voltage applications comprises a P type lightly doped region 5, a P type heavily doped region 22, and an N type WELL region 1 encompassing an N type heavily doped region 8 wherein the P type heavily doped region 22 encompasses the P type lightly doped region 5 and the N type WELL region 1. The P type lightly doped region 5 may encompass a P type heavily doped region 6 for connection to an electrode with better electrical properties.

The N type heavily doped region 8 may be entirely or partially replaced by a lightly doped region. The N type heavily doped region 8 connects to the N type WELL region 1 where P type circuit components or layout patterns are developed on. Similarly, the P type heavily doped region 22 may be entirely or partially replaced by a lightly doped region. The P type heavily doped region 22 connects to the substrate. The layout pattern 25 forms an ESD protection circuit comprising two transistors which will be described later in FIG. 6.

Figure 3:
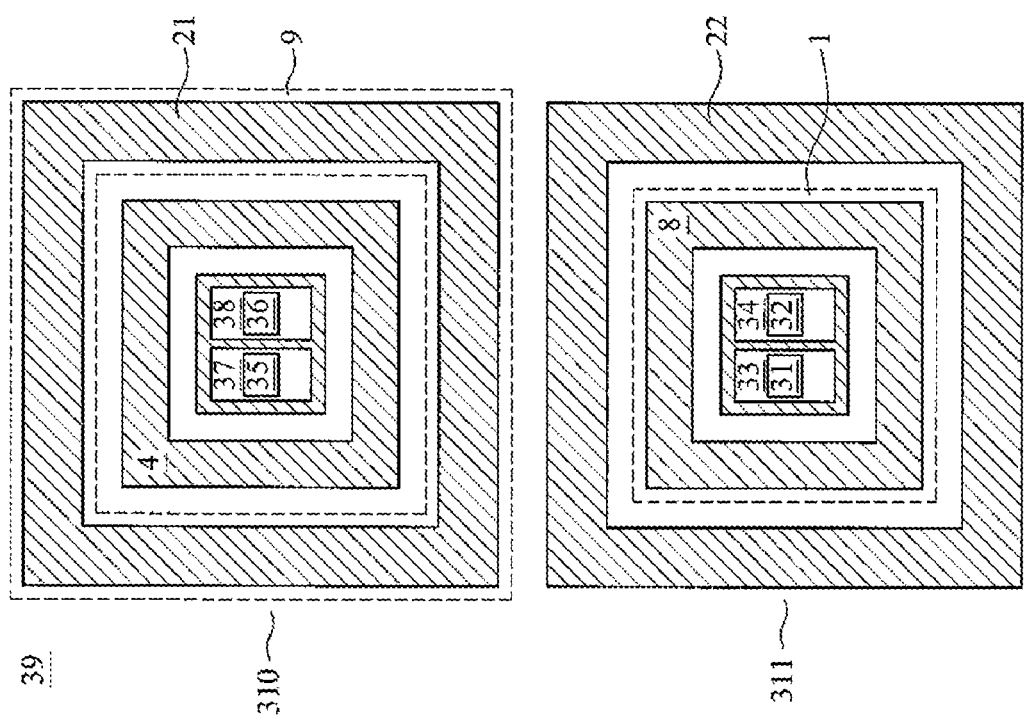
FIG. 3 shows layout patterns of an ESD protection circuit for high voltage application with more than one NDD (N type Diffusion Diode) and/or PDD (P type Diffusion Diode) diode according to one embodiment of the invention.

FIG. 3 shows layout patterns 39 of an ESD protection circuit for high voltage applications with more than one NDD (N type Diffusion Diode) and/or PDD (P type Diffusion Diode) diode. In this figure, same reference numerals are used as in the FIG. 2. According to one embodiment, a layout pattern 310 of an ESD protection circuit may comprise a plurality of N type lightly doped regions 37, 38, a P type heavily doped region 4, and an N type WELL region 9 encompassing an N type heavily doped region 21. The N type lightly doped regions 37, 38 may encompass N type heavily doped regions 35, 36 for connection to an electrode with better electrical properties. Effectively, it is practical to use a plurality of N type lightly doped regions 37, 38 such that a plurality of circuit components can be formed in parallel. For example, the parasitic resistance can be reduced with this parallel circuit configuration.

According to another embodiment of the present invention, a layout pattern 311 of an ESD protection circuit for high voltage applications comprises a plurality of P type lightly doped regions 33, 34, a P type heavily doped region 22, and an N type WELL region 1 encompassing an N type heavily doped region 8. The P type lightly doped regions 33, 34 may encompass a P type heavily doped regions 31, 32 for connection to an electrode with better electrical properties. In practical layout, the P type lightly doped regions 33, 34 are used to improve electrical connections. For example, the parasitic resistance thereof can be reduced.

Figure 4:
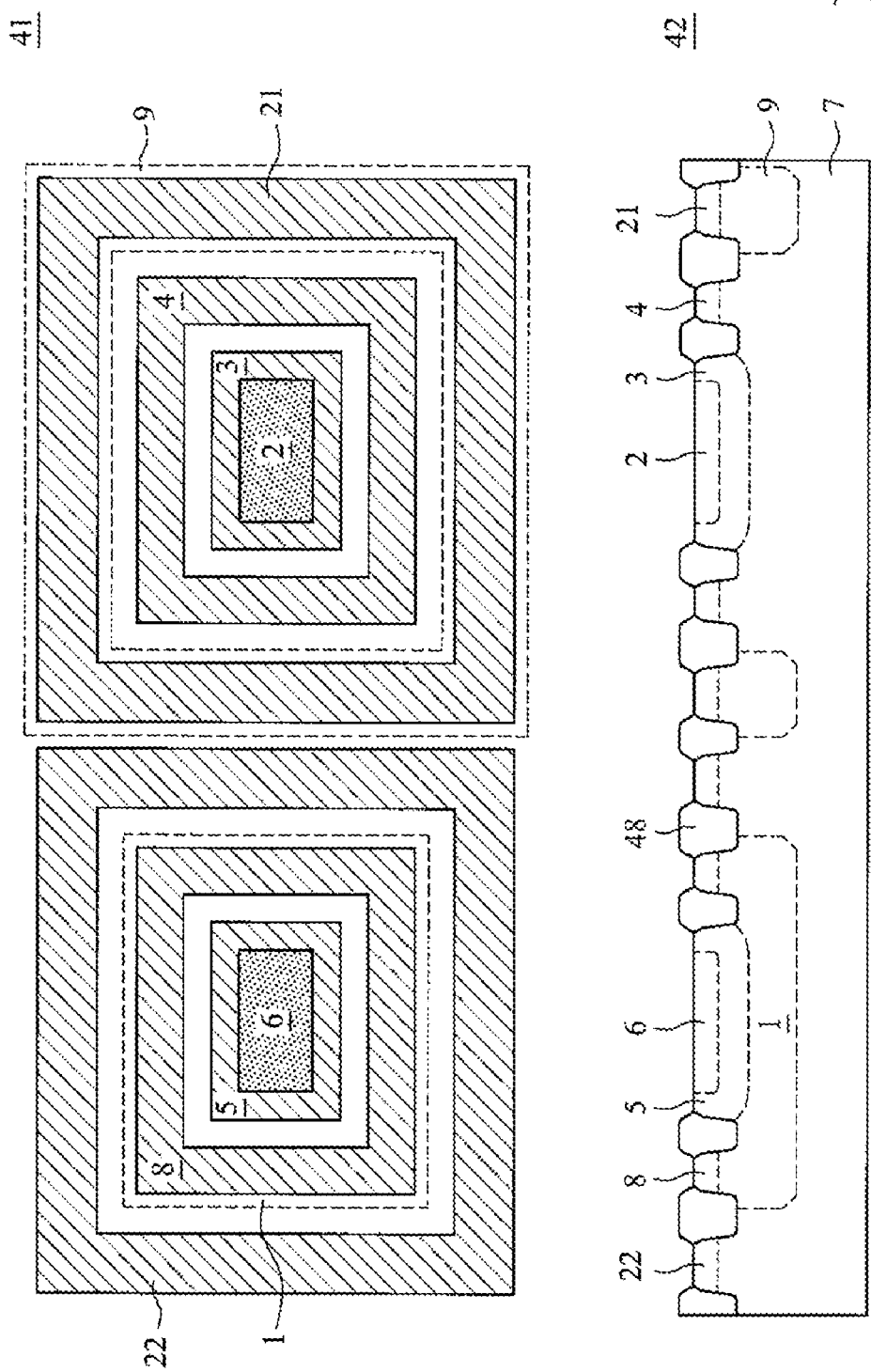
FIG. 4 is a cross-section diagram of an ESD protection circuit for high voltage application according to the embodiment shown in FIG. 2.

FIG. 4 is a cross-section diagram of an ESD protection circuit for high voltage applications according to the embodiment shown in FIG. 2. In this figure, the same reference numerals are used as in FIG. 2. From this cross-section diagram, the layout patterns and circuit components are formed on the substrate 7, which may be a P type substrate. The depth of the N type WELL region 1 is deeper than that of the heavily or lightly doped regions. One N type WELL region 1 supports and encompasses the P type lightly doped region 5, and therefore forms a PN junction interface between them. Another PN junction interface is formed between the substrate 7 and the N type lightly doped region 3. Isolation 48 between diffusion regions can be made by trench oxide or other field oxide known by those skilled in the art.

Figure 5:
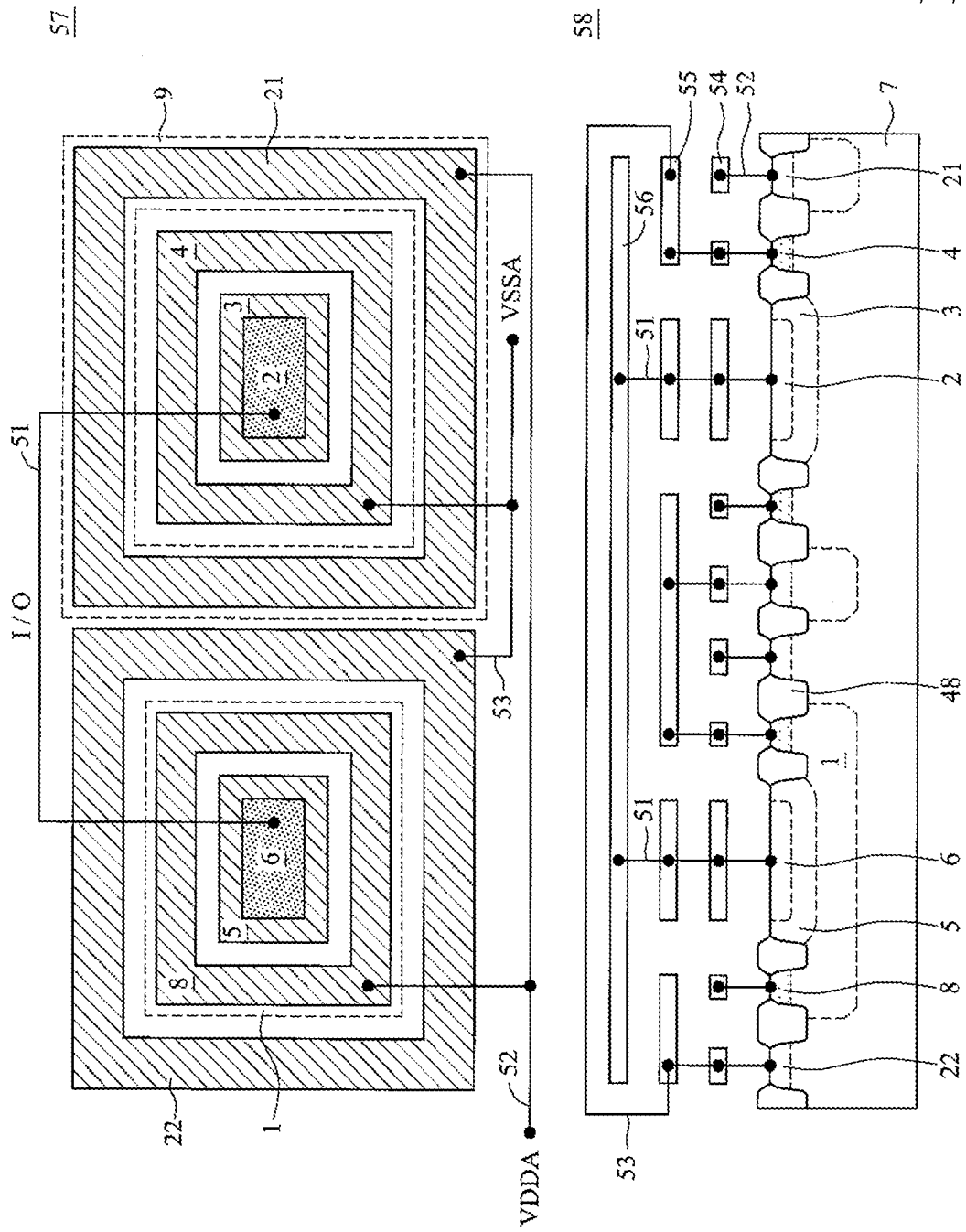
FIG. 5 shows the wire connection of an ESD protection circuit for protecting I/O pads according to the embodiment shown in FIG. 2.

FIG. 5 shows the wire connection of an ESD protection circuit for protecting I/O pads according to the embodiment shown in FIG. 2. The cross-section diagram of the ESD protection circuit with three metal layers is also shown here. In this figure, the same reference numerals are used as in the previous figures. Here, an ESD protection circuit positioned under an I/O pad is illustrated. In order to put the ESD protection circuit under the pads for saving layout areas, there should be at least three metal layers (including one metal layer for the pads). However, using two metal layers is sufficient to form the ESD protection circuit if the ESD protection circuit does not need to be positioned under the I/O pads. In one embodiment, a circuit configuration of an ESD protection circuit for I/O pads comprises at least one pad 51 connected to an N type lightly doped region 3 and a P type lightly doped region 5, a ground 53, and a power source 52, wherein the ground 53 connects to P type heavily doped regions 4, 22 and the power source 52 connects to N type heavily doped regions 8, 21. Moreover, the N type lightly doped region 3 may comprise an N type heavily doped region 2 for reducing resistance and improving electrical properties. The P type lightly doped region 5 may also comprise a P type heavily doped region 6 for the same reason. In order to implement this circuit configuration under the pad as shown on a semiconductor chip, three metal layers 54, 55, 56 are required. In other embodiments, some connections may use metal wires and some may use poly wires or intrinsic materials, e.g., P type heavily doped diffusion wires or N type heavily doped diffusion wires.

Figure 6:
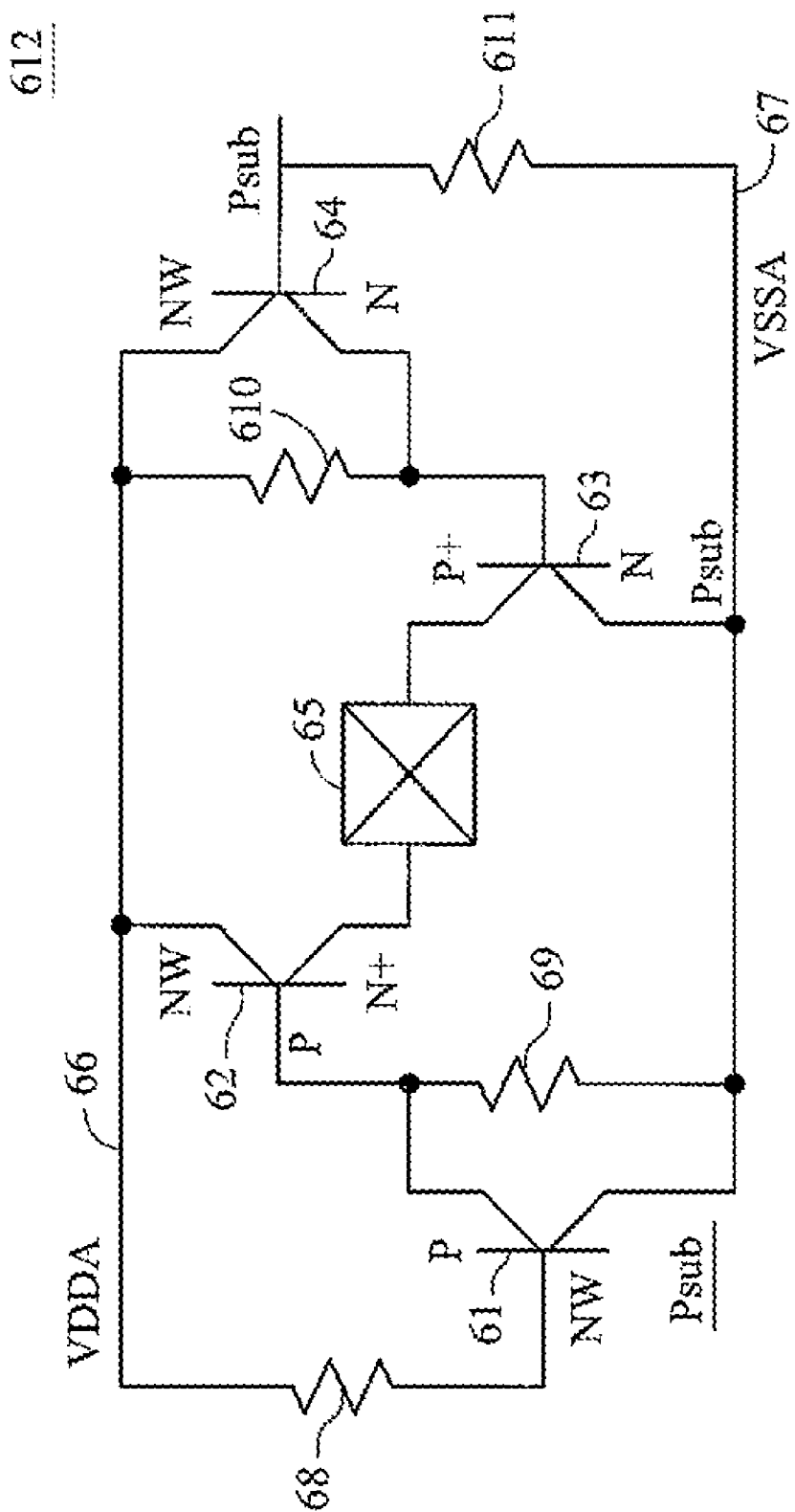
FIG. 6 illustrates an ESD protection circuit according to the wire connection shown in FIG. 5.

FIG. 6 illustrates an ESD protection circuit according to the circuit configuration shown in FIG. 5. According to one embodiment, an ESD protection circuit 612 for protecting I/O pads comprises a power source VDDA 66, a ground VSSA 67, a pad 65 and four bipolar junction transistors (BJT) 61, 62, 63, 64. These parasitic bipolar junction transistors are described as following: (1) the BJT 61 is a PNP BJT which has a N type WELL region 9 as a base, a P type substrate 7 as an emitter, and a P type heavily doped region 4 as a collector; (2) the BJT 62 is an NPN BJT which has the P type heavily doped region 4 as a base, a N type heavily doped region 2 as an emitter, and the N type WELL region 9 as a collector; (3) the BJT 63 is a PNP BJT which has a N type heavily doped region 8 as a base, a P type heavily doped region 6 as a collector, and the P type substrate 7 as an emitter; and (4) the BJT 64 is an NPN BJT which has the P substrate 7 as a base, an N type WELL region 1 as a collector, and the N type heavily doped region 8 as an emitter. The ESD protection circuit 612 further comprises a resistor 68 representing the parasitic resistance in the N type WELL region 9, a resistor 69 representing the parasitic resistance in the P substrate 7, a resistor 610 representing the parasitic resistance in the N type WELL region 1, and a resistor 611 representing the parasitic resistance in the P substrate 7. The operations and functions of the ESD protection circuit 612 will be described later in FIG. 11, 12, 13, and 14.

Figure 7:
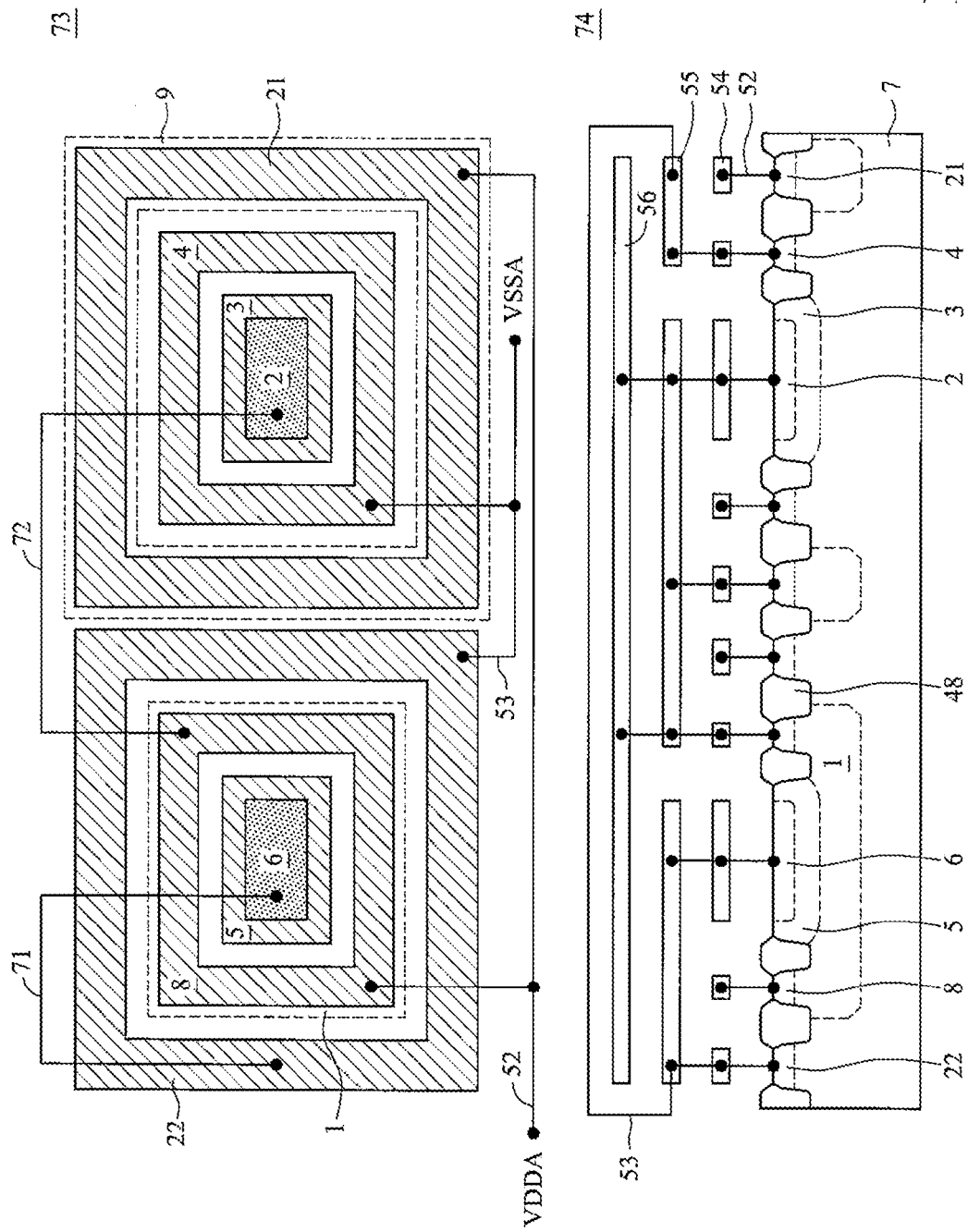
FIG. 7 shows the wire connection of an ESD protection circuit for protecting power pads according to one embodiment of the invention.

FIG. 7 shows the wire connection 73 of an ESD protection circuit for protecting power pads according to one embodiment of the invention. The cross-section diagram 74 of the ESD protection circuit with three metal layers is also shown here. In this figure, same reference numerals are used as in the previous figures. Here, an ESD protection circuit positioned under a power pad for protecting the power pad is illustrated. In order to put the ESD protection circuit under pads for saving layout areas, there should be at least three metal layers (including one metal layer for the pads). However, using two metal layers is sufficient to form the ESD protection circuit if the ESD protection circuit does not need to be positioned under the power pads. In one embodiment, a circuit configuration 73 of an ESD protection circuit for power pads comprises a power connection 72 connected to an N type lightly doped region 3 and an N type heavily doped region 8, a power source 52 connected to the N type heavily doped region 8 and an N type heavily doped region 21, a ground connection 71 connected to a P type lightly doped region 5, and a P type heavily doped region 22, and a ground 53 connected to the P type heavily doped region 22 and a P type heavily doped region 4. Moreover, the N type lightly doped region 3 may comprise an N type heavily doped region 2 for reducing resistance and improving electrical properties. The P type lightly doped region 5 may also comprise a P type heavily doped region 6 for the same reasons. In order to implement this circuit configuration, three metal layers 54, 55, 56 are required. In other embodiments, some connections may use metal wires and some may use poly wires or intrinsic materials, e.g., P type heavily doped diffusion wires or N type heavily doped diffusion wires. The operations and functions of the ESD protection circuit will be described later in FIG. 9 and FIG. 10.

Figure 8:
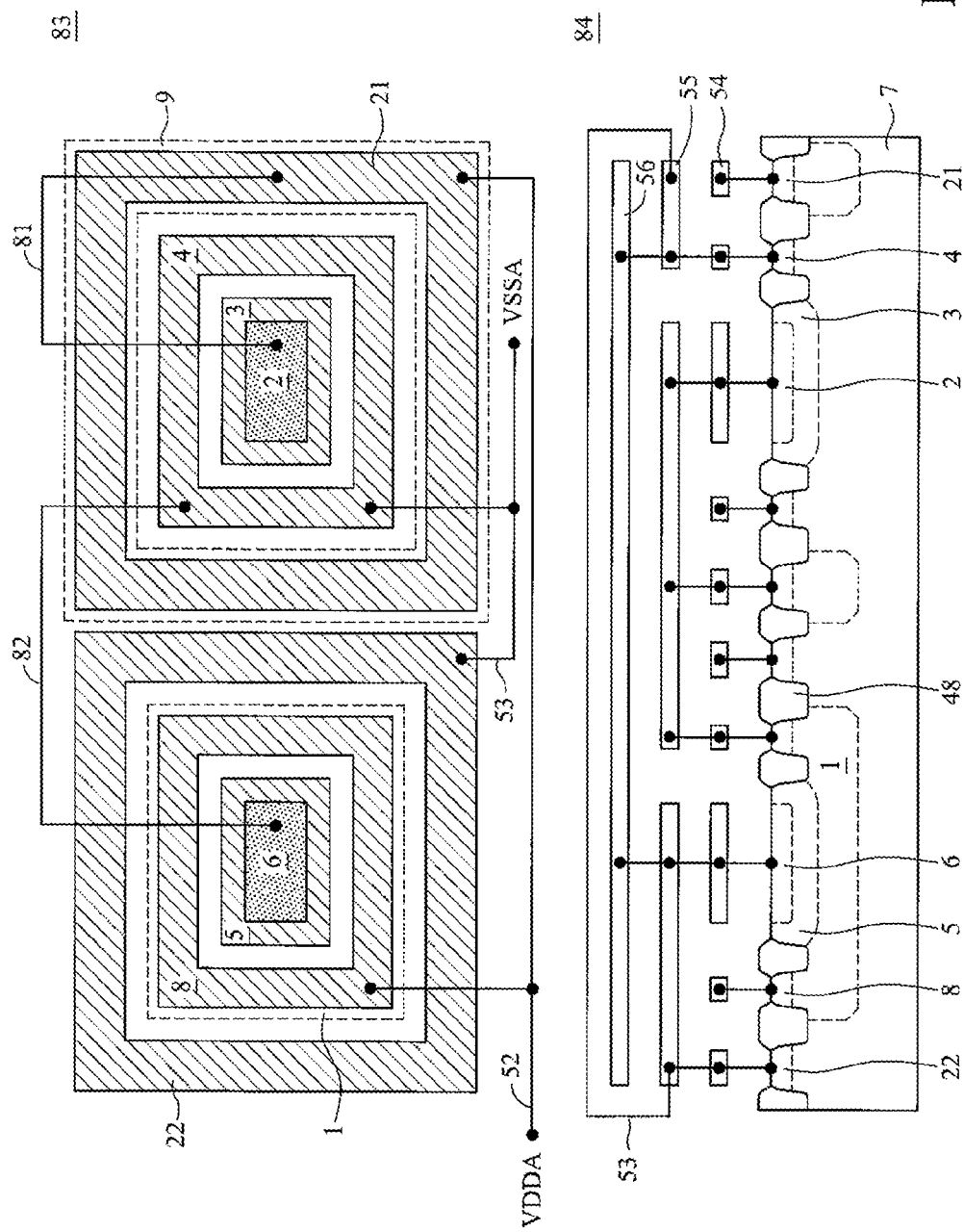
FIG. 8 shows the wire connection of an ESD protection circuit for protecting ground pads according to one embodiment of the invention.

FIG. 8 shows the wire connection 83 of an ESD protection circuit for protecting ground pads according to one embodiment of the invention. The cross-section diagram 84 of the ESD protection circuit with three metal layers is also shown here. In this figure, the same reference numerals are used as in the previous figures. Here, an ESD protection circuit positioned under a ground pad is illustrated. In order to put the ESD protection circuit under pads for saving layout areas, there should be at least three metal layers (including a metal layer for the pads). However, using two metal layers is sufficient to form the ESD protection circuit if the ESD protection circuit does not need to be placed under the ground pads. In one embodiment, a circuit configuration 83 of an ESD protection circuit for ground pads comprises a ground connection 82 connected to a P type lightly doped region 5 and a P type heavily doped region 4, a power source 52 connected to an N type heavily doped region 8 and an N type heavily doped region 21, a power connection 81 connected to an N type lightly doped region 3, and the N type heavily doped region 21, and a ground 53 connected to the P type heavily doped region 4 and a P type heavily doped region 22. Moreover, the N type lightly doped region 3 may comprise an N type heavily doped region 2 for reducing resistance and improving electrical properties. The P type lightly doped region 5 may also comprise a P type heavily doped region 6 for the same reason. In order to implement this circuit configuration, three metal layers 54, 55, 56 are required. In other embodiments, some wire connections may use metal wires and some may use poly wires or intrinsic materials, e.g., P type heavily doped diffusion wires or N type heavily doped diffusion wires. The operations and functions of the ESD protection circuit will be described later in FIG. 9 and FIG. 10.

Figure 9:
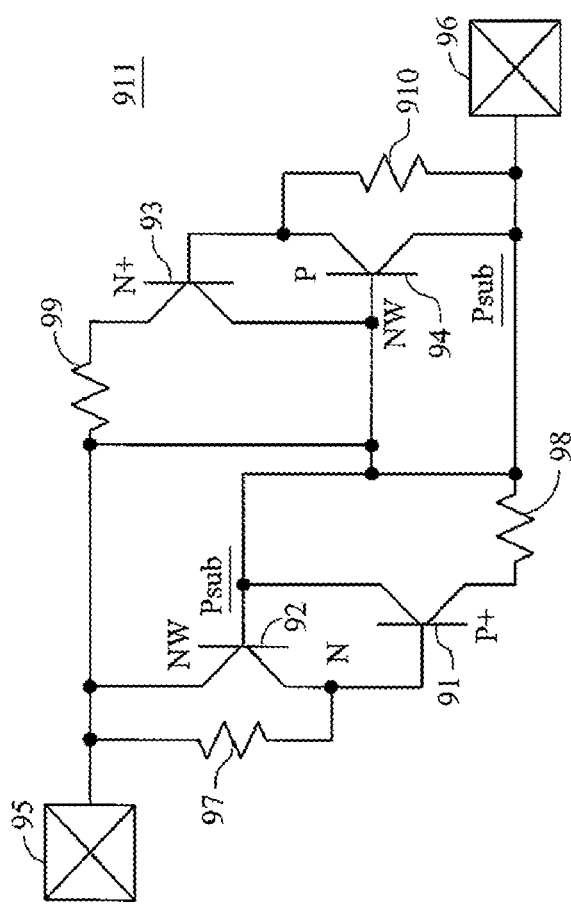
FIG. 9 illustrates an ESD protection circuit for protecting power and ground pads according to one embodiment of the invention.

FIG. 9 illustrates an ESD protection circuit 911 for protecting power and ground pads according to one embodiment of the invention. Please refer to FIG. 5 and FIG. 7 which show the electrical connections of ESD protection circuits for the I/O pads and the power pads, respectively. The main difference between the two is that there is no I/O pad in FIG. 7, and the N type lightly doped region 3, originally connected to the I/O pad in FIG. 5, is connected to the N type heavily doped region 8 which is connected to the power source 52. Furthermore, the P type lightly doped region 5, originally connected to the I/O pad, is connected to the P type heavily doped region 22 which is connected to the ground 53. Therefore, several circuit components of the ESD protection circuit in FIG. 6 are reduced. The collector and emitter of BJT 62 and BJT 63 in FIG. 6 are shorted. The BJT 61 in FIG. 6 becomes a BJT 94 in FIG. 9, and the BJT 64 in FIG. 6 becomes a BJT 93 in FIG. 9. Moreover, the resistor 69 in FIG. 6 becomes a resistor 910 in FIG. 9, and the resistor 610 in FIG. 6 becomes a resistor 99 in FIG. 9.

Please refer to FIG. 5 and FIG. 8 which show the electrical connections of ESD protection circuits for the I/O pads and the ground pads, respectively. The main difference between the two is that FIG. 8 lacks an I/O pad, and the P type lightly doped region 5, originally connected to the I/O pad in FIG. 5, is connected to the P type heavily doped region 4 which is connected to the ground 53. Furthermore, the N type lightly doped region 3, originally connected to the I/O pad in FIG. 5, is connected to the N type heavily doped region 21 which is connected to the power source 52. Similarly, two BJTs are shorted, and the ESD protection circuit for protecting the ground pad comprises a BJT 92, a BJT 91, and two resistors 97, 98.

Referring to FIG. 9, if there is a positive electrical transient occurred on a power pad 95, the BJT 94, which is a PNP BJT, will be turned on first and force the collector thereof to short to the ground. Thus, excessive current on the power pad 95 may pass through the break down junction of the BJT 93 and leak to the ground. Likewise, if there is a negative electrical transient occurred on a ground pad 96, the BJT 92, which is an NPN BJT, will be turned on first. Thus, excessive current on the ground pad 96 may pass through the break down junction of the BJT 91 and provide a current path to the power source. Similar protection mechanism may apply to other ESD stress conditions. For example, the ESD protection can protect a negative electrical transient on the power pad 95 and a positive electrical transient on the ground pad 96.

Figure 10:
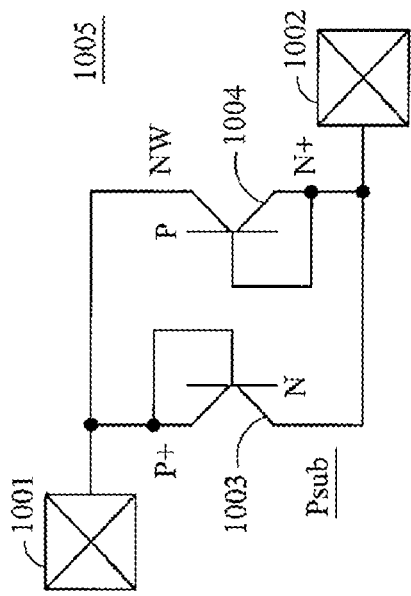
FIG. 10 illustrates another ESD protection circuit for protecting power and ground pads according to one embodiment of the invention.

FIG. 10 illustrates another ESD protection circuit 1005 for protecting power and ground pads according to one embodiment of the invention. In the embodiment, an ESD protection circuit comprises a BJT 1003 and a BJT 1004 wherein each base of the BJTs is connected to the collector thereof. A positive electrical transient on a power pad 1001 may be leaked through the break down junction of the BJT 1004, and a negative electrical transient on a ground pad 1002 may be leaked through the break down junction of the BJT 1003. Similar protection mechanism may apply to other ESD stress conditions. For example, the ESD protection can protect a negative electrical transient on the power pad 1001 and a positive electrical transient on the ground pad 1002. The ESD protection circuit 1005 shows only one variation from the circuit 911 in FIG. 9. Many variations may be possible. For example, there may be a resistor inserted between the collector of the BJT 1003 and the ground pad 1002 such that the base thereof may have more time to switch on. Moreover, different doping concentration may be applied without changing the types of dopants.

Figure 11:
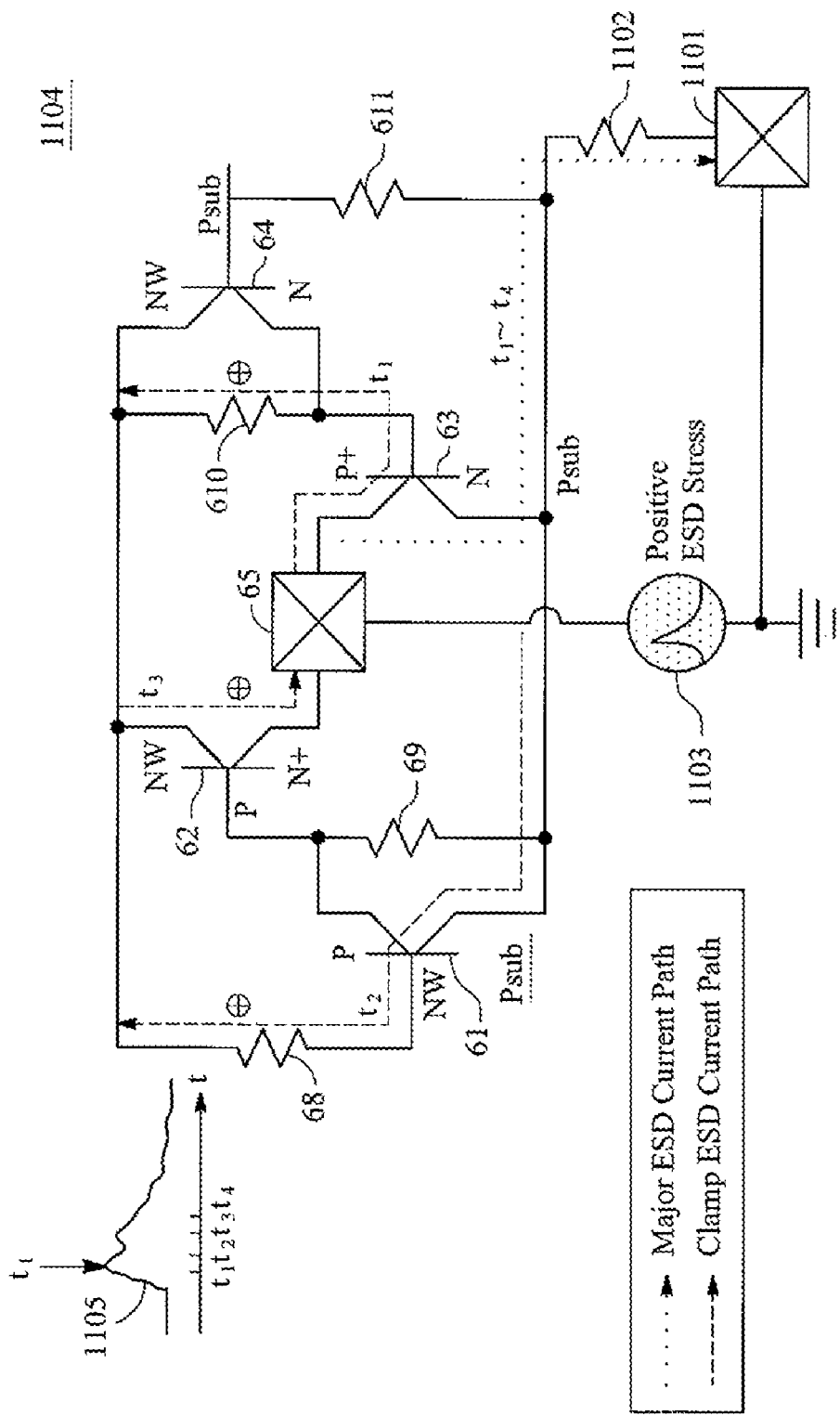
FIG. 11 illustrates the operations of the ESD protection circuit shown in FIG. 6 when a positive ESD stress is applied between an I/O pad and a ground pad.

FIG. 11 illustrates the operations of the ESD protection circuit shown in FIG. 6 when a positive ESD stress is applied between an I/O pad and a ground pad. In this figure, the same reference numerals are used as in the previous figures. An ESD testing configuration 1104 under VSS mode with a positive ESD stress 1103 comprises an ESD protection circuit under test as the circuit 612 mentioned in FIG. 6, a ground pad 1101 and a resistor 1102, wherein the positive ESD stress 1103 couples with the pad 65 and the ground pad 1101. A diagram 1105 shows the positive ESD stress 1103 in a time scale with time t1, t2, t3, and t4 sequentially.

At time t1, a positive ESD stress 1103 occurs on pad 65 and then passes through the PN junction of the BJT 63 and the resistor 610. Meanwhile, a portion of the ESD current leaks to the ground pad 1101 through the channel of the BJT 63, and the voltage of the positive ESD stress drops a little bit after the time t1. At time t2, the voltage of the positive ESD stress 1103 rises due to a portion of current flowing from the ground pad 1101 through the BJT 61 to the resistor 68. At time t3, most of the injecting charges flow through the BJT 62 and back to the pad 65. During the time t1~t4, the excessive ESD charges continue to discharge to the ground pad 1101 through the BJT 63.

Figure 12:
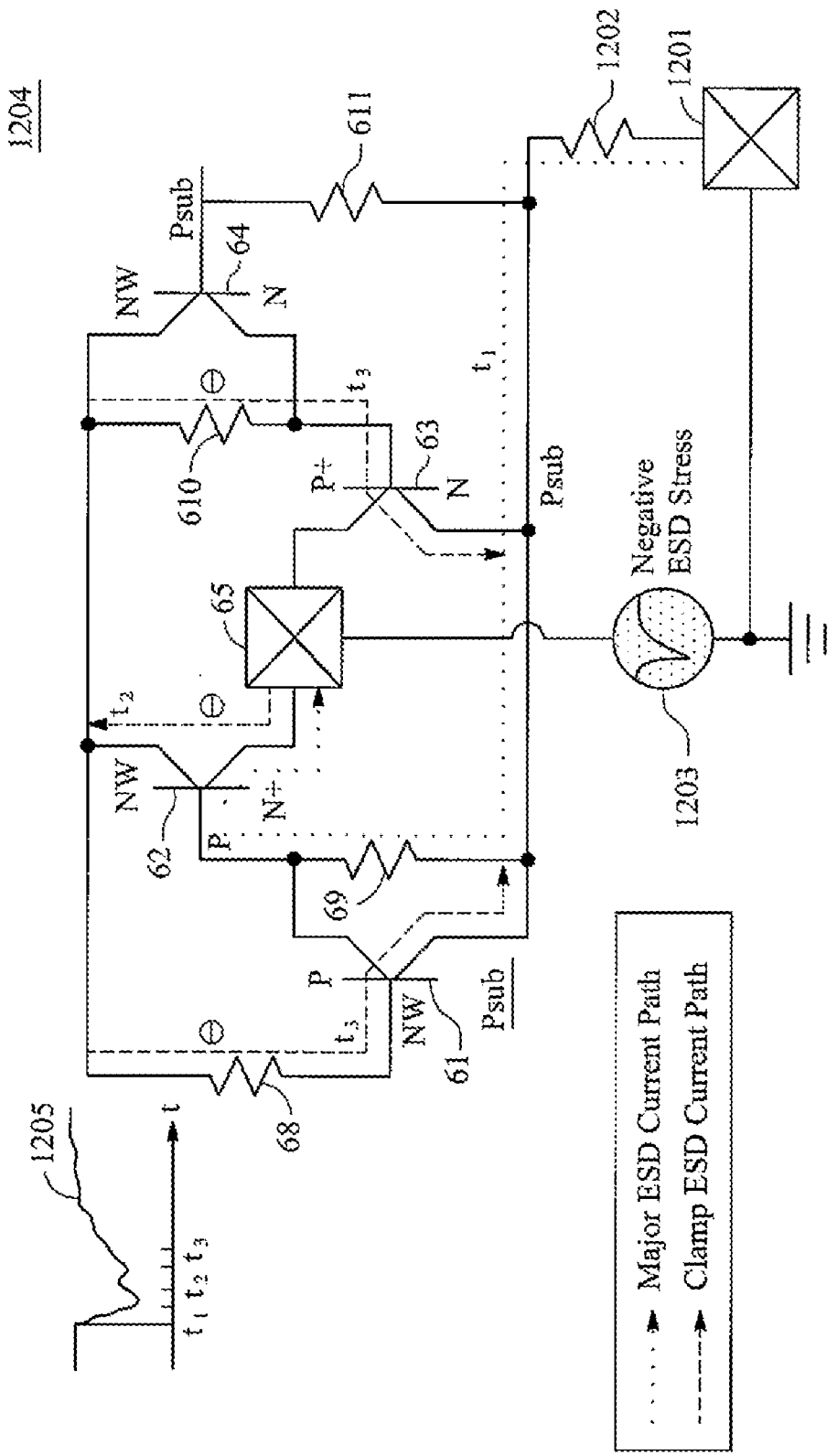
FIG. 12 illustrates the operations of the ESD protection circuit shown in FIG. 6 when a negative ESD stress is applied between an I/O pad and a ground pad.

FIG. 12 illustrates the operations of the ESD protection circuit shown in FIG. 6 when a negative ESD stress 1203 is applied between an I/O pad and a ground pad. In this figure, the same reference numerals are used as in the previous figures. An ESD testing configuration 1204 under VSS mode with negative ESD stress 1203 comprises an ESD protection circuit under test as the circuit 612 in FIG. 6, a ground pad 1201 and a resistor 1202, wherein the negative ESD stress 1203 couples with the pad 65 and the ground pad 1201. A diagram 1205 shows the negative ESD stress 1203 in a time scale with time t1, t2, t3, and t4 sequentially. The major ESD current path of the negative ESD stress 1203 from the pad 65 is through the NP junction of the BJT 62 to the ground pad 1201. The BJTs 61, 62, 63, 64 may provide other clamp ESD current paths at the time t2 and time t3. During the time t1~t4, the excessive ESD charges continue to discharge to the ground pad 1201 through the BJT 62.

Figure 13:
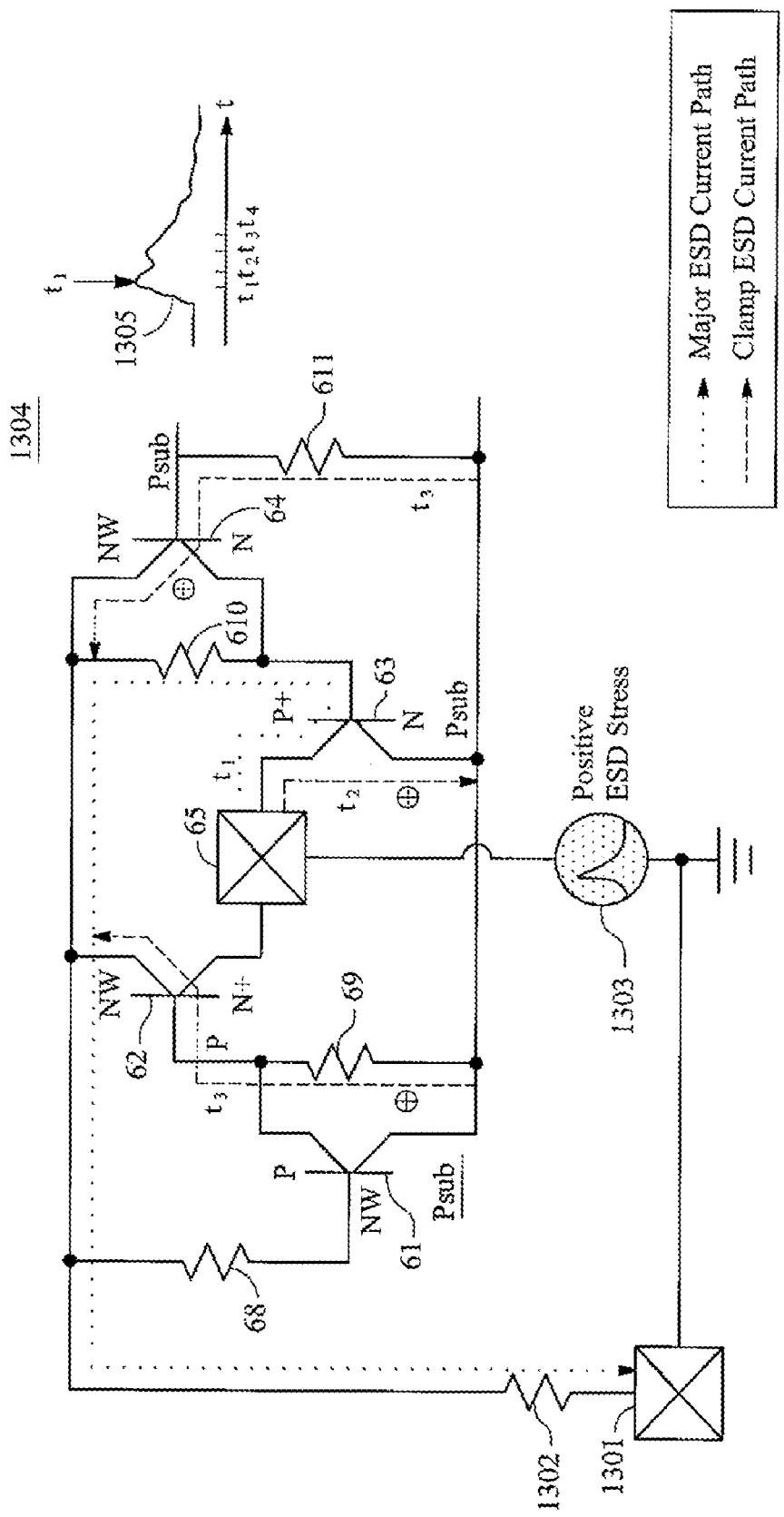
FIG. 13 illustrates the operations of the ESD protection circuit shown in FIG. 6 when a positive ESD stress is applied between an I/O pad and a power pad.

FIG. 13 illustrates the operations of the ESD protection circuit shown in FIG. 6 when a positive ESD stress 1303 is applied between an I/O pad and a power pad. In this figure, the same reference numerals are used as in the previous figures. An ESD testing configuration 1304 under VDD mode with positive ESD stress 1303 comprises an ESD protection circuit 612 as mentioned in FIG. 6, a power pad 1301 and a resistor 1302, wherein the positive ESD stress 1303 couples with the pad 65 and the power pad 1301. A diagram 1305 shows the positive ESD stress 1303 in a time scale with time t1, t2, t3, and t4 sequentially. The major ESD current path of the positive ESD stress 1303 from the pad 65 is through the PN junction of the BJT 63 to the power pad 1301. The BJTs 61, 62, 63, 64 may provide other clamp ESD current paths at the time t2 and time t3. During the time t1~t4, the excessive ESD charges continue to discharge to the power pad 1301 through the BJT 63.

Figure 14:
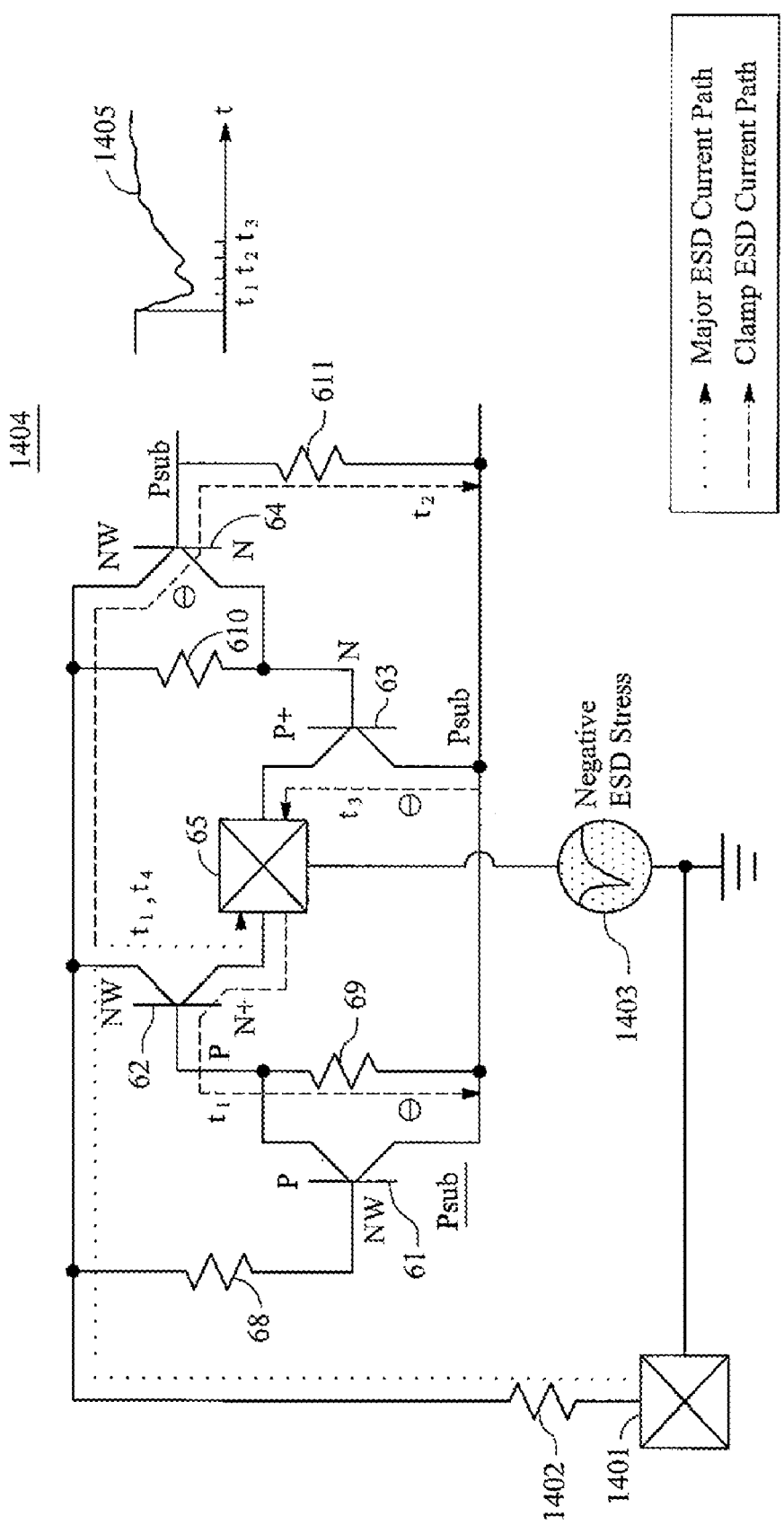
FIG. 14 illustrates the operations of the ESD protection circuit shown in FIG. 6 when a negative ESD stress is applied between an I/O pad and a power pad.

FIG. 14 illustrates the operations of the ESD protection circuit shown in FIG. 6 when a negative ESD stress 1403 is applied between an I/O pad and a power pad. In this figure, the same reference numerals are used as in the previous figures. An ESD testing configuration 1404 under VDD mode with negative ESD stress 1403 comprises an ESD protection circuit 612 as described in FIG. 6, a power pad 1401 and a resistor 1402, wherein the negative ESD stress 1403 couples with the pad 65 and the power pad 1401. A diagram 1405 shows the negative ESD stress 1403 in a time scale with t1, t2, t3, and t4 sequentially. The major ESD current path of the negative ESD stress 1403 from the pad 65 is through the channel of the BJT 62 to the power pad 1401. The BJTs 61, 62, 63, 64 may provide other clamp ESD current paths at the time t2 and time t3. During the time t1~t4, the excessive ESD charges continue discharging to the power pad 1401 through the BJT 62.

Please refer to FIG. 11~FIG. 14. The ESD protection circuits for protecting I/O pads utilizes BJTs or the junction thereof to direct ESD stress current to be clamped to the power rail in the beginning. Then, the ESD protection circuits provide various ESD current paths, including parasitic BJTs and diodes, such that the ESD stress current may find other optional current paths to pass through and release the tension of the major protection BJTs or diodes. Therefore, the layout pattern of the ESD protection circuit does not require large area but can carry extensive ESD stress current.

Figure 15:
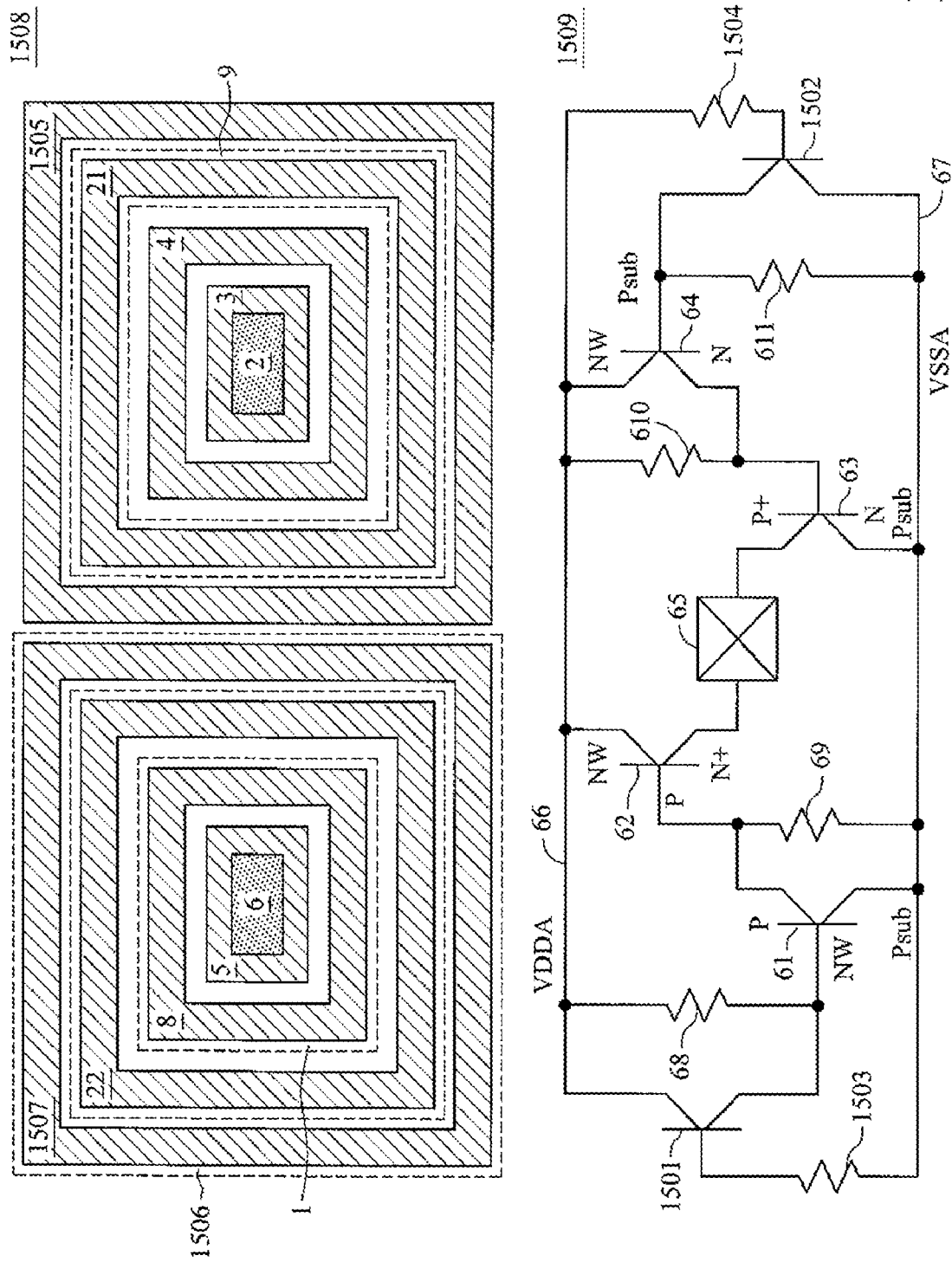
FIG. 15 shows an extensive layout patterns and an ESD protection circuit according to one preferred embodiment of the invention.

FIG. 15 shows layout patterns and an ESD protection circuit according to one preferred embodiment of the invention. In this figure, the same reference numerals are used as in the previous figures. Here, a layout pattern 1508 for protecting I/O pads comprises a layout pattern 41 mentioned in FIG. 4, an N type heavily doped region 1507 that is encompassed by an N type WELL region 1506 and that couples with the P type heavily doped region 22; and a P type heavily doped region 1505 that couples with the N type heavily doped region 21.

According to another embodiment, a circuit configuration 1509 corresponding to the layout pattern 1508 is shown in FIG. 15. The circuit configuration 1509 is similar to the circuit mentioned in FIG. 6 but further comprises BJTs 1502, 1501 and resistors 1503, 1504, in order to increase more current paths for ESD stress currents to pass through. The operation and function of the circuit 1509 can be easily understood by those skilled in the art when read in conjunction with the previous description and disclosure.

It is to be understood that these embodiments are not meant as limitations of the invention but merely exemplary descriptions of the invention. Indeed, different adaptations may be apparent to those skilled in the art without departing from the scope of the annexed claims. For instance, it is possible to add more than six parasitic BJTs, similar to the extensive design in FIG. 15, to increase current paths. Moreover, it is possible to use different doping concentrations for N type or P type regions.

What is claimed is:

1. An electrical static damage protection device comprising:
   a substrate;
   a first device region formed in the substrate, the first device region including:
      a first doped region of a first dopant type;
      a first well region of the first dopant type spaced apart from the first doped region;
      a second doped region of the first dopant type located in the first well region;
      a third doped region of a second dopant type located outside the first well region and adjacently between the first and second doped region;
   a second device region formed in the substrate spaced apart from the first device region, the second device region including:
      a second well region of the first dopant type;
      a fourth doped region of the second dopant type formed in the second well region;
      a fifth doped region of the first dopant type located in the second well region and spaced apart from the fourth doped region;
      a sixth doped region of the second dopant type outside the second well region, wherein the fifth doped region is located adjacently between the fourth and sixth doped region; and
   an electrical wiring coupled with the first and second device region for forming a shunt circuit adapted to discharge electrical static charges.

2. The device of claim 1, wherein the first dopant type is N-type.

3. The device of claim 1, wherein the second dopant type is P-type.

4. The device of claim 1, wherein the first doped region comprises a plurality of doped sub-regions of the first dopant type formed therein.

5. The device of claim 1, wherein the first doped region comprises a lightly doped region of the first dopant type.

6. The device of claim 1, wherein the first doped region comprises a heavily doped region of the first dopant type formed therein.

7. The device of claim 1, wherein the fourth doped region comprises a plurality of doped sub-regions of the second dopant type formed therein.

8. The device of claim 1, wherein the fourth doped region comprises a plurality of doped sub-regions of the second dopant type formed therein.

9. The device of claim 1, wherein the electrical wiring comprises:
   a first wiring connecting the third doped region and the sixth doped region with a ground potential;
   a second wiring connecting the second doped region and the fifth doped region with a power potential; and
   a third wiring connecting the first doped region and the fourth doped region with an input/output pad.

10. The device of claim 1, wherein the electrical wiring comprises:
    a first wiring connecting the third doped region and the sixth doped region with a ground pad;
    a second wiring connecting the second doped region and the fifth doped region with a power pad;
    a third wiring connecting the first doped region with the fifth doped region; and
    a fourth wiring connecting the fourth doped region with the sixth doped region.

11. The device of claim 1, wherein the electrical wiring comprises:
    a first wiring connecting the third doped region and the sixth doped region with a ground pad;
    a second wiring connecting the second doped region and the fifth doped region with a power pad;
    a third wiring connecting the third doped region with the fourth doped region; and
    a fourth wiring connecting the first doped region with the second doped region.

12. The device of claim 1, wherein the first device region further comprises a seventh doped region of the second dopant type located outside the first well region, the second doped region being located between the third doped region and the seventh doped region, and the second device region further comprises an eighth doped region of the first dopant type, the sixth doped region being located between the fifth doped region and the eighth doped region.

13. The device of claim 12, wherein the eighth doped region is formed in a third well region of the first dopant type spaced apart from the sixth doped region.

* * * * *